(12) United States Patent
Aleksov et al.

(10) Patent No.: US 10,121,679 B1
(45) Date of Patent: Nov. 6, 2018

(54) PACKAGE SUBSTRATE FIRST-LEVEL-INTERCONNECT ARCHITECTURE

(71) Applicant: Intel Corporation, Santa Clara, CA (US)

(72) Inventors: Aleksandar Aleksov, Chandler, AZ (US); Kristof Darmawikarta, Chandler, AZ (US); Arnab Sarkar, Chandler, AZ (US); Hiroki Tanaka, Chandler, AZ (US); Robert A. May, Chandler, AZ (US); Sri Ranga Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,384

(22) Filed: Sep. 29, 2017

(51) Int. Cl.
    *H01L 23/532* (2006.01)
    *H01L 21/48* (2006.01)
    *H01L 23/00* (2006.01)
    *H01L 23/498* (2006.01)

(52) U.S. Cl.
    CPC .... *H01L 21/4853* (2013.01); *H01L 23/49811* (2013.01); *H01L 23/49866* (2013.01); *H01L 23/53209* (2013.01); *H01L 24/12* (2013.01); *H01L 24/16* (2013.01); *H01L 2224/16227* (2013.01); *H01L 2224/16238* (2013.01)

(58) Field of Classification Search
    CPC ............. H01L 21/4814; H01L 2021/60; H01L 2021/60007; H01L 2021/60015; H01L 2021/60022; H01L 23/53204; H01L 24/15
    See application file for complete search history.

(56) References Cited

U.S. PATENT DOCUMENTS

| 9,240,377 | B2 | 1/2016 | Qian et al. |
| 2004/0266179 | A1 | 12/2004 | Sharma |
| 2007/0111516 | A1* | 5/2007 | Abbott ................ H01L 21/4846 438/624 |
| 2008/0054313 | A1 | 3/2008 | Dyer et al. |
| 2009/0075465 | A1 | 3/2009 | Fan |
| 2012/0007211 | A1 | 1/2012 | Aleksov et al. |
| 2013/0267092 | A1 | 10/2013 | Shin et al. |

(Continued)

FOREIGN PATENT DOCUMENTS

| WO | 2017/044106 A1 | 3/2017 |
| WO | 2017/052647 A1 | 3/2017 |

OTHER PUBLICATIONS

Interational Search Report and Written Opinion dated May 30, 2016 for International Application No. PCT/US2015/052460, 12 pages.

*Primary Examiner* — Cheung Lee
(74) *Attorney, Agent, or Firm* — Schwabe, Williamson & Wyatt, P.C.

(57) ABSTRACT

Embodiments of the present disclosure may relate to a package substrate that may include a layer having a layer surface that is planarized and a via within the layer, where the via includes a via surface that is exposed on the layer surface, and where the via surface is planarized. The package substrate may further include a bond pad on the layer surface, where a first thickness of the bond pad includes a seed layer on the via surface, and where a second thickness of the bond pad includes a plating stack on the seed layer. Other embodiments may be described or claimed.

21 Claims, 10 Drawing Sheets

(56) References Cited

U.S. PATENT DOCUMENTS

| | | | |
|---|---|---|---|
| 2014/0335658 A1* | 11/2014 | Scanlan | H01L 21/78 |
| | | | 438/113 |
| 2014/0339699 A1* | 11/2014 | Arvin | H01L 23/49816 |
| | | | 257/738 |
| 2015/0187607 A1* | 7/2015 | Huang | H01L 21/565 |
| | | | 438/126 |
| 2015/0206836 A1 | 7/2015 | Bian | |
| 2017/0018525 A1 | 1/2017 | Dias et al. | |
| 2018/0025999 A1* | 1/2018 | Yu | H01L 23/66 |

* cited by examiner

PACKAGE SUBSTRATE FIRST-LEVEL-INTERCONNECT ARCHITECTURE

FIELD

Embodiments of the present disclosure relate generally to semiconductor packaging. More particularly, embodiments of the present disclosure relate to bond pads for package substrates.

BACKGROUND

Electronic devices typically include integrated circuit (IC) die. The IC die may be inserted into an IC package to form a first level assembly before it is incorporated into a higher level assembly. Over time, electronic devices typically include more features, and thus more IC die, in the same amount of space or in less space. Use of an increased number of IC die in an IC package may therefore result in space-related issues in electronic devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
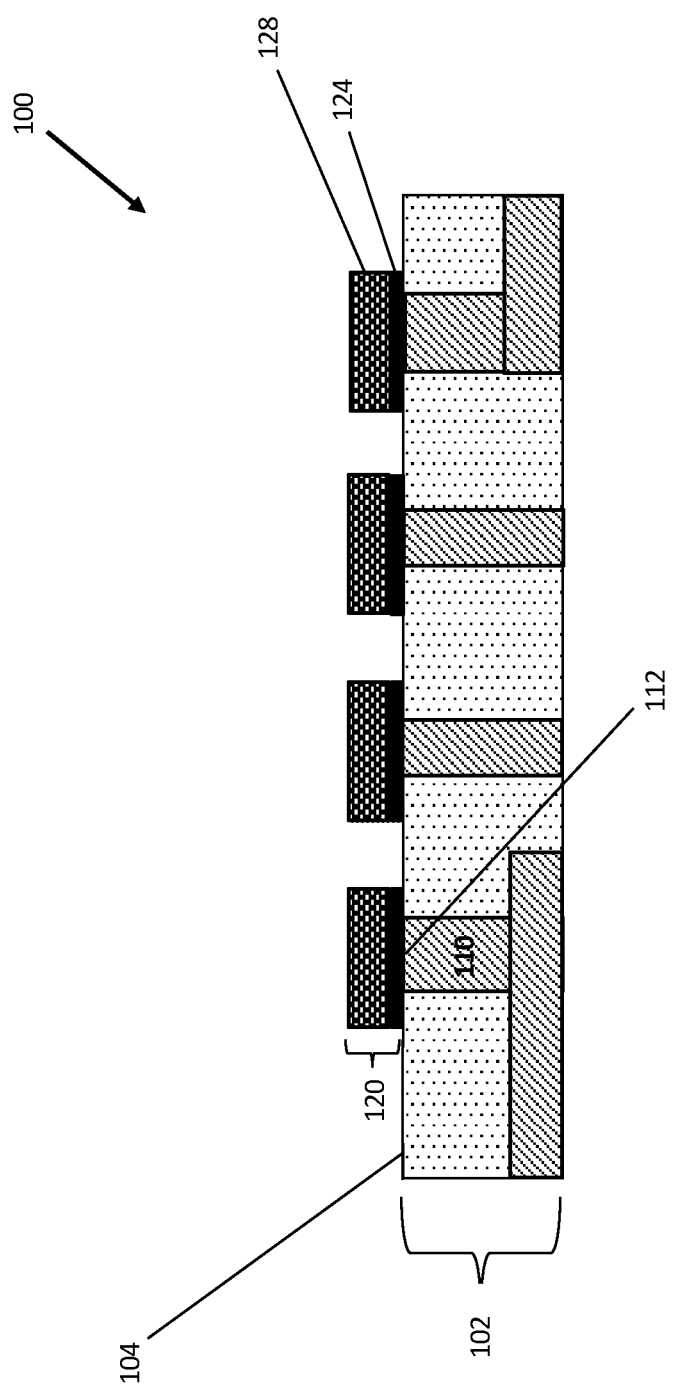
FIG. 1 depicts an example package substrate, in accordance with various embodiments.

Embodiments of the present disclosure may relate to a package substrate that may include a layer having a layer surface that is planarized and a via within the layer, where the via includes a via surface that is exposed on the layer surface, and where the via surface is planarized. The package substrate may further include a bond pad on the layer surface, where a first thickness of the bond pad includes a seed layer on the via surface, and where a second thickness of the bond pad includes a plating stack on the seed layer.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

An IC die may be coupled with a package substrate to form an IC package. The IC package may be referred to as a first level assembly. The first level assembly may include an electrical connection between the IC die and the package substrate, for example, between a bond pad of the IC die, which may be referred to as an IC pad of the IC die, and a bond pad of the package substrate. The electrical connection between the IC die and the package substrate may be referred to as a first level interconnect (FLI). The IC package may be coupled with, for example, a circuit board, to form a second level assembly for an electronic device. An electrical connection between the package substrate and the circuit board may be referred to as a second level interconnect.

As electronic devices include more features, and thus more IC die, it may be challenging to include the IC die in the same amount of space. The challenge may be even greater as electronic devices become smaller and more compact. The distance between bond pads of a package substrate may be referred to as the pitch. This distance also may be referred to as the bump pitch, given that a solder bump may be used to couple the bond pad with an IC pad to form an FLI. The ability to provide a finer pitch, and thus place IC die closer to one another, may enable more IC die to be coupled with a package substrate.

Thickness variation of an FLI may limit the ability to provide finer bump pitches. For example, a large thickness variation of an FLI may lead to package substrates designed at finer pitch and yield losses at the die-to-package-assembly process. Consequently, knowing that a given process has FLI thickness variation may lead to providing coarser bump pitches to avoid yield loss.

Planarization may refer to the removal of material to even out irregular topography of a surface and thus make the surface relatively flat or planar. Planarization of inner layers of a substrate package may be one way to compensate for thickness variation of an FLI on an outer surface. However, planarization of inner layers may lead to thickness variation of the inner layers, which may cause performance issues in the package substrate, such as, for example, impedance mismatch issues or reliability issues. Further, FLI thickness variation may be exacerbated by the presence of multiple inner layers, each of which may have thickness variation.

As part of the manufacturing process, copper plating and dry film photoresist, which also may be referred to as dry film resist (DFR), may be applied to an FLI. Planarization after copper plating an FLI and polishing both the DFR and the copper plating may be another way to address thickness variation of an FLI. However, this may subject the package substrate to additional processes that may introduce additional FLI thickness variation, which may negate the intended benefits of this approach.

Embodiments herein relate to aspects that enable the ability to provide a package substrate that has an FLI with relatively small thickness variation. The ability to reduce FLI thickness variation may enable the ability to provide a finer pitch. The ability to provide a finer pitch may reduce yield loss and increase the number of IC die that may be coupled with a package substrate.

FIG. 1 depicts an example package substrate, in accordance with various embodiments. Package substrate 100 may include a layer 102 having a layer surface 104 that is planarized. Layer 102 may be a dielectric layer that includes any type of dielectric material, including, but not limited to, for example, solder resist, buildup films, organic materials, inorganic materials such as silicon dioxide ($SiO_2$), organic materials filled with inorganic fillers, etc. Layer surface 104 may be a top surface, a side surface, an angled surface, a bottom surface, or any other surface of layer 102.

Package substrate 100 may further include a via 110 within the layer 102, where the via 110 includes a via surface 112 that is exposed on the layer surface 104, and where the via surface 112 is planarized. The via 110 may be an electrically conductive microelectronic structure that electrically couples structures above a via with structures below the via. The via surface 112 may be a top surface, a side surface, an angled surface, a bottom surface, or any other surface of via 110.

The layer surface 104 and via surface 112 may be planarized using any chemical planarization process, any mechanical planarization process, any chemical-mechanical planarization (CMP) process, or any other process that results in layer surface 104 and via surface 112 being flat or substantially flat. Chemical planarization may include, for example, applying a chemical or immersing an object in a chemical, to, for example, remove material from a surface or even out irregular topography, to make the surface flat or substantially flat. Mechanical planarization may include, for example, rotating a pad or moving a pad on a surface, to, for example, remove material from a surface or even out irregular topography, to make the surface flat or substantially flat. CMP may be a hybrid of chemical planarization and mechanical planarization that may include, for example, applying a chemical and a rotating or moving pad on a surface, to, for example, remove material from a surface or even out irregular topography, to make the surface flat or substantially flat.

Package substrate 110 may further include a bond pad 120 on the layer surface 104, where a first thickness of the bond pad 120 includes a seed layer 124 on the via surface 112, and wherein a second thickness of the bond pad includes a plating stack 128 on the seed layer 124. Bond pad 120 may provide electric continuity when coupled with an IC pad of an IC die. As used herein, a reference to being "on" a surface or a structure includes being on any side of the surface or structure, including being on a top, a side, a bottom, or any other part of the surface or structure.

Seed layer 124 may be referred to as a surface finish. In some embodiments, seed layer 124 may be a titanium-copper (Ti—Cu) layer, where the titanium is on the layer surface 112, and the copper is on the titanium. In some embodiments, the thickness of the titanium may be less than 0.5 micrometers (um), measured from where the titanium contacts the layer surface 112 to the end of titanium opposite where it contacts the layer surface 112, and the thickness of the copper may be less than 2.5 um, measured from where the copper contacts the titanium to the end of the copper opposite where it contacts the titanium. In some embodiments, the seed layer 124 may be a titanium layer. In some embodiments, the thickness of the titanium may be less than 3 um. In some embodiments, the seed layer 124 may be a tungsten-copper (W—Cu) layer, where the tungsten is on the layer surface, and the copper is on the tungsten. In some embodiments, the thickness of the tungsten may be less than 0.5 um, measured from where the tungsten contacts the layer surface 112 to the end of tungsten opposite where it contacts the layer surface 112, and the thickness of the copper may be less than 2.5 um, measured from where the copper contacts the tungsten to the end of the copper opposite where it contacts the tungsten. In some embodiments, the seed layer 124 may be a tantalum-copper (Ta—Cu) layer, where the tantalum is on the layer surface, and where the copper is on the tantalum. In some embodiments, the thickness of the tantalum may be less than 0.5 um, measured from where the tantalum contacts the layer surface 112 to the end of tantalum opposite where it contacts the layer surface 112, and the thickness of the copper may be less than 2.5 um, measured from where the copper contacts the tantalum to the end of the copper opposite where it contacts the tantalum.

In some embodiments, plating stack 128 may be a nickel-palladium-gold (Ni—Pd—Au or NPG) stack, where the nickel may be on the seed layer 124, the palladium may be on the nickel, and the gold may be on the palladium. In some embodiments, the thickness of the nickel may be less than 10 um, measured from where the nickel contacts the seed layer 124 to the end of the nickel opposite where it contacts the seed layer 124, and it may be between 2 um and 0.5 um, again measured from where the nickel contacts the seed layer 124 to the end of the nickel opposite where it contacts the seed layer 124; the thickness of the palladium may be less than 0.5 um, measured from where the palladium contacts the nickel to the end of the palladium opposite where it contacts the nickel; and the thickness of the gold may be less than 5 um, measured from where the gold contacts the palladium to the end of the gold opposite where it contacts the palladium. In some embodiments, the plating stack 128 may be a cobalt/tungsten alloy-palladium-gold stack, where the cobalt/tungsten alloy may be on the seed layer, the palladium may be on the cobalt/tungsten alloy, and gold may be on the palladium. In some embodiments, the plating stack 128 may be a nickel-copper stack, where the nickel may be on the seed layer and the copper may be on the nickel.

In some embodiments, the plating 128 stack may be an electrolytic stack or an electroless stack. For an electrolytic stack, which also may be referred to as an elytic stack, an electric current may be used for deposition of the plating material. For an electroless stack, something other than an electric current, for example, a chemical agent, may be used for deposition of the plating material. In some embodiments, package substrate 100 may include solder on the bond pad 120. Solder may help to form the FLI between the package substrate 100 and an IC die during assembly of an IC package. Alternatively or additionally, the solder may be on an IC pad of the IC die. The solder may be any type of solder that helps to form the FLI and may be any lead-free or leaded solder. The solder may be, for example, tin-copper, tin-silver, tin-silver-copper that includes 96.5% tin, 3% silver, and 0.5% copper (SAC305), or tin-silver-copper that includes 95.5% tin, 4% silver, and 0.5% copper (SAC405). In some embodiments, a material other than solder, for example, copper or gold, may be used to help form the FLI.

Although FIG. 1 depicts the package substrate 100 as including one layer, package substrate 100 may include any number of layers. Further, although FIG. 1 depicts package substrate 100 as including a certain number of bond pads, package substrate 100 may include any number of bond pads. Similarly, although FIG. 1 depicts package substrate 100 as including a certain number of vias, package substrate 100 may include any number of vias.

Figure 2:
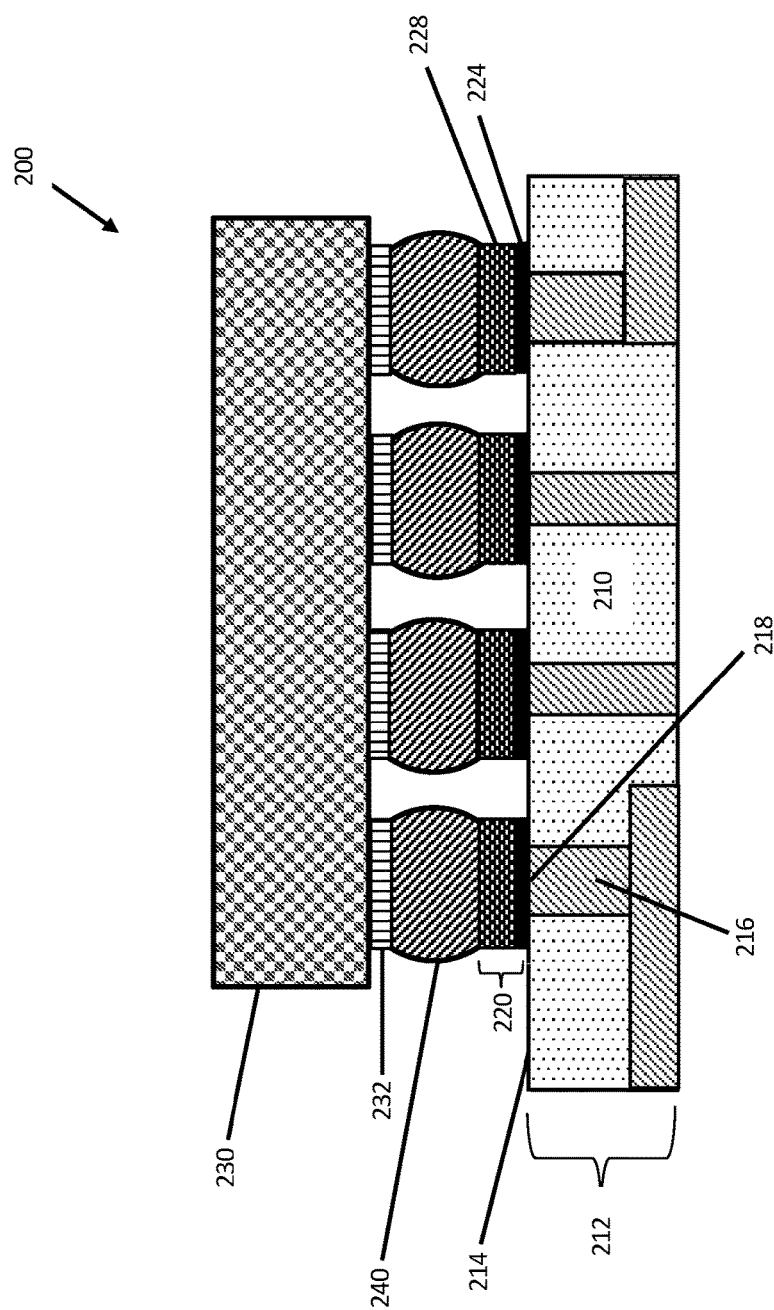
FIG. 2 depicts an example IC package, in accordance with various embodiments.

FIG. 2 depicts an example IC package, in accordance with various embodiments. IC package 200 may include a package substrate 210, such as, for example, package substrate 100. The package substrate 210 may include a dielectric layer 212 having a dielectric surface 214 that is planarized. The package substrate 210 may further include a via 216 buried in the dielectric layer 212, where the via 216 includes a via surface 218 that is exposed on the dielectric surface 214, and where the via surface 218 is planarized.

The package substrate 210 may further include a bond pad 220 on the dielectric surface 214, where a first thickness of the bond pad 220 includes a surface finish 224 on the via surface 218. In some embodiments, the surface finish 224 may be a seed layer that includes titanium and copper. Further, a second thickness of the bond pad 220 may include a plating stack 228 on the surface finish 224. In some embodiments, the thickness of the titanium may be less than 0.5 um, measured from where the titanium contacts the layer surface 112 to the end of titanium opposite where it contacts the layer surface 112, and the thickness of the copper may be less than 2.5 um, measured from where the copper contacts the titanium to the end of the copper opposite where it contacts the titanium. In some embodiments, the plating stack 228 may be an NPG stack, where the nickel is on the surface finish, the palladium is on the nickel, and the gold is on the palladium. In some embodiments, the thickness of the nickel may be less than 10 um, measured from where the nickel contacts the seed layer 124 to the end of the nickel opposite where it contacts the seed layer 124; the thickness of the palladium may be less than 0.5 um, measured from where the palladium contacts the nickel to the end of the palladium opposite where it contacts the nickel; and the thickness of the gold may be less than 5 um, measured from where the gold contacts the palladium to the end of the gold opposite where it contacts the palladium. In some embodiments, the plating 228 stack may be an electrolytic stack.

IC package 200 may further include a die 230 that includes an IC pad 232. IC die 230 may be any type of IC die, for example, a single element semiconductor, such as, for example, a silicon IC die; or, for example, a compound semiconductor, such as, for example, a gallium arsenide (GaAs) IC die. IC package 200 may further include solder 240 coupled with the bond pad 220 and the IC pad 232, to form an FLI between the package substrate 210 and the IC die 230. The solder 240 may be on the bond pad 220. Alternatively or additionally, the solder 240 may be on the IC pad 232. The solder may be any type of solder that helps to form the FLI and may be any lead-free or leaded solder. The solder may be, for example, tin-copper, tin-silver, tin-silver-copper that includes 96.5% tin, 3% silver, and 0.5% copper (SAC305), or tin-silver-copper that includes 95.5% tin, 4% silver, and 0.5% copper (SAC405). In some embodiments, a material other than solder, for example, copper or gold, may be included to help form the FLI.

Although FIG. 2 depicts the package substrate 210 as including one layer, package substrate 210 may include any number of layers. Further, although FIG. 2 depicts package substrate 210 as including a certain number of bond pads, package substrate 200 may include any number of bond pads. Similarly, although FIG. 2 depicts package substrate 200 as including a certain number of vias, package substrate 200 may include any number of vias.

Figure 3A:
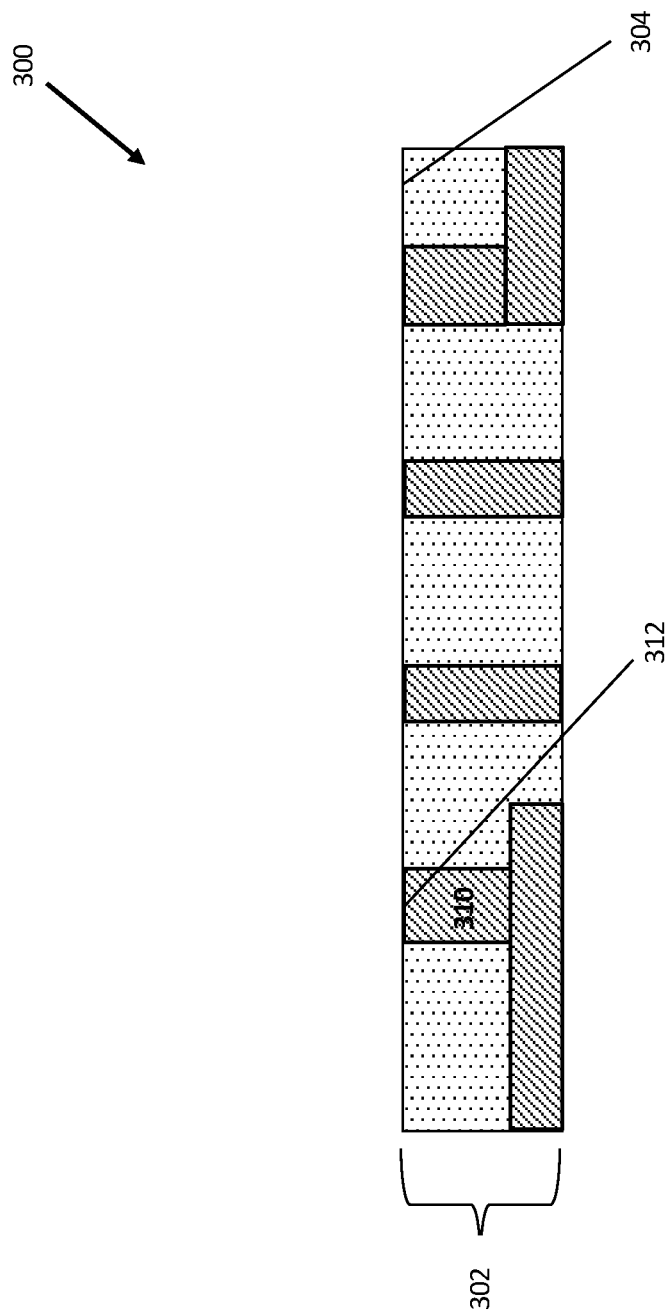
FIGS. 3A, 3B, 3C, 3D, 3E, and 3F depict integrated circuit layers representing various operations in an example process of producing a package substrate, in accordance with various embodiments

FIGS. 3A-3F depict portions of integrated circuit layers representing various operations in an example process of producing a package substrate, in accordance with various embodiments. Referring to FIG. 3A, starting structure 300 may include a layer 302 having a layer surface 304 that is planarized. Layer 302 may be, for example, layer 102 described above, and layer surface 304 may be, for example, layer surface 104 described above.

Starting structure 300 may further include a via 310 within the layer 302, where the via 310 includes a via surface 312 that is exposed on the layer surface 304, and where the via surface 312 is planarized. Via 310 may be, for example, via 110 described above, and via surface 312 may be, for example, via surface 112 described above.

Figure 3B:
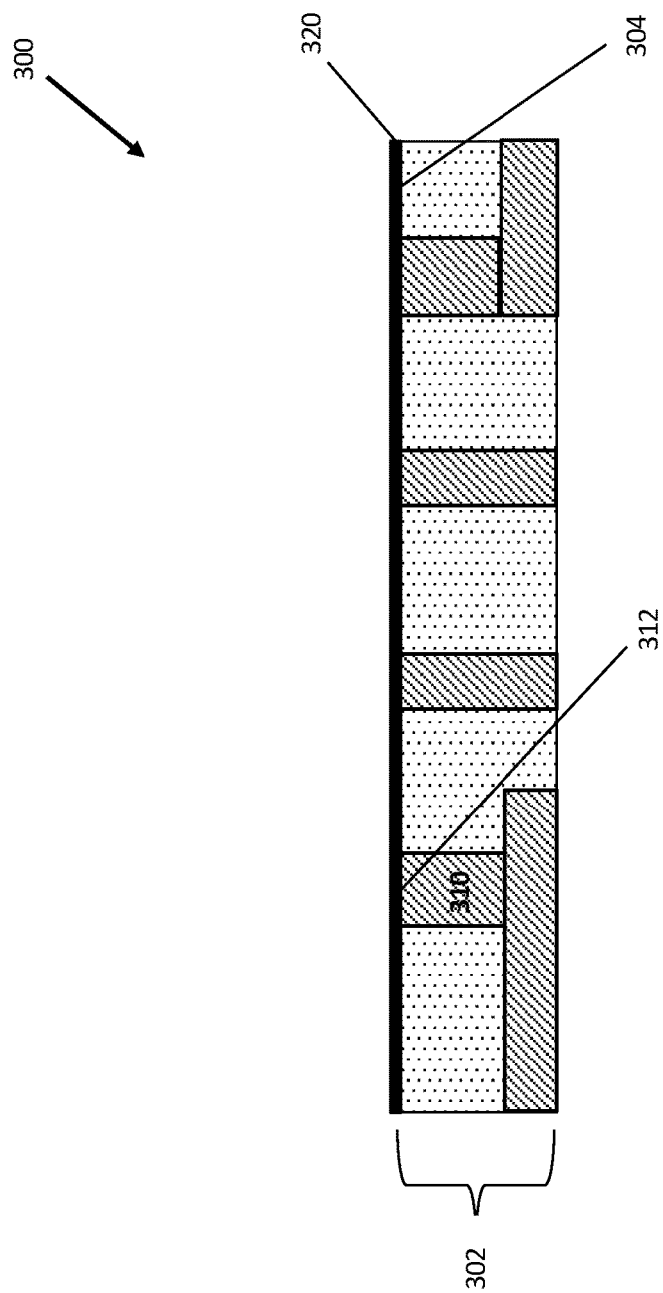
Figure 3C:
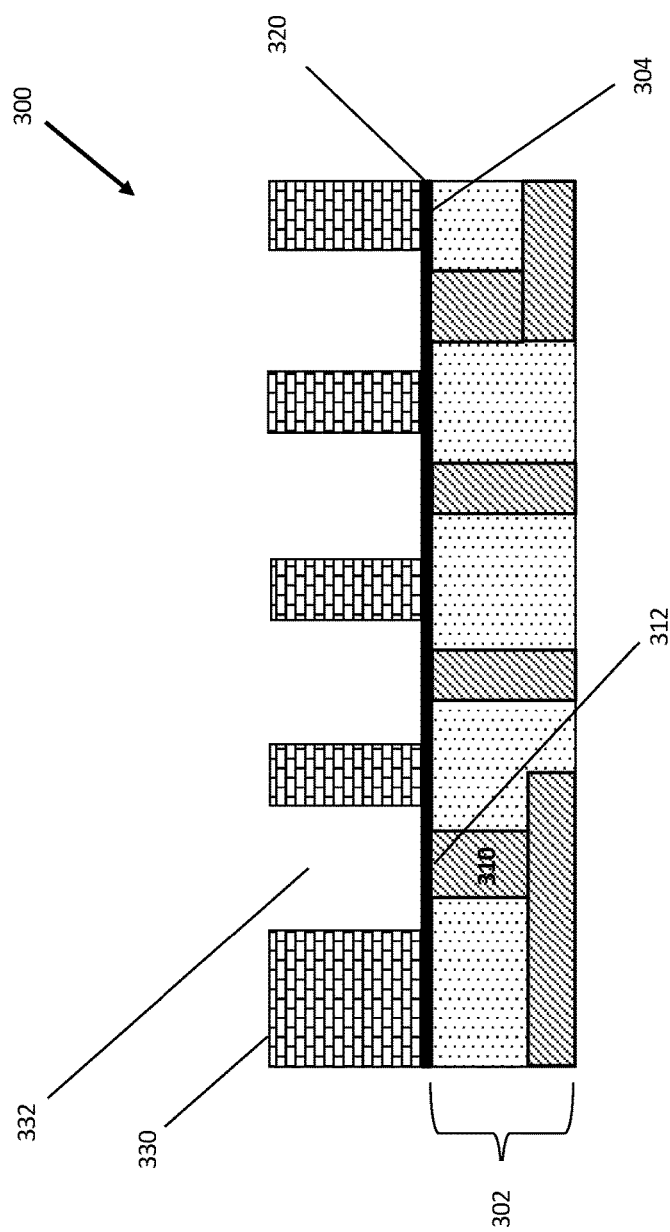

Referring to FIG. 3B, a seed layer 320 may be deposited on the layer surface 304, where the seed layer 320 may cover the via 310. Seed layer 320 may be, for example, seed layer 124 described above. Referring to FIG. 3C, lamination 330, which may be any lamination, including, for example, DFR lamination, may be placed on seed layer 320, where the lamination 320 includes an opening 332 over the via 310. Placement of the lamination 330 may be based on, for example, defining a bond pad size or shape, using, for example, a patterning process that may include use of, for example, resist material.

Figure 3D:
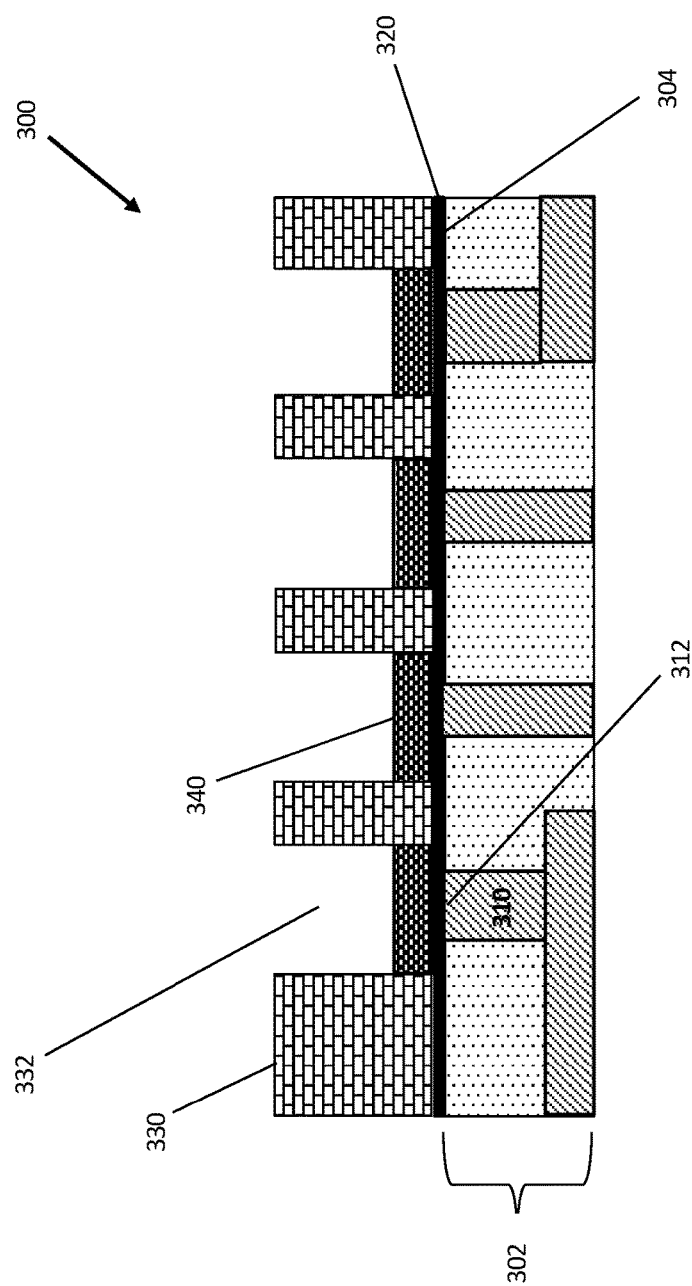
Figure 3E:
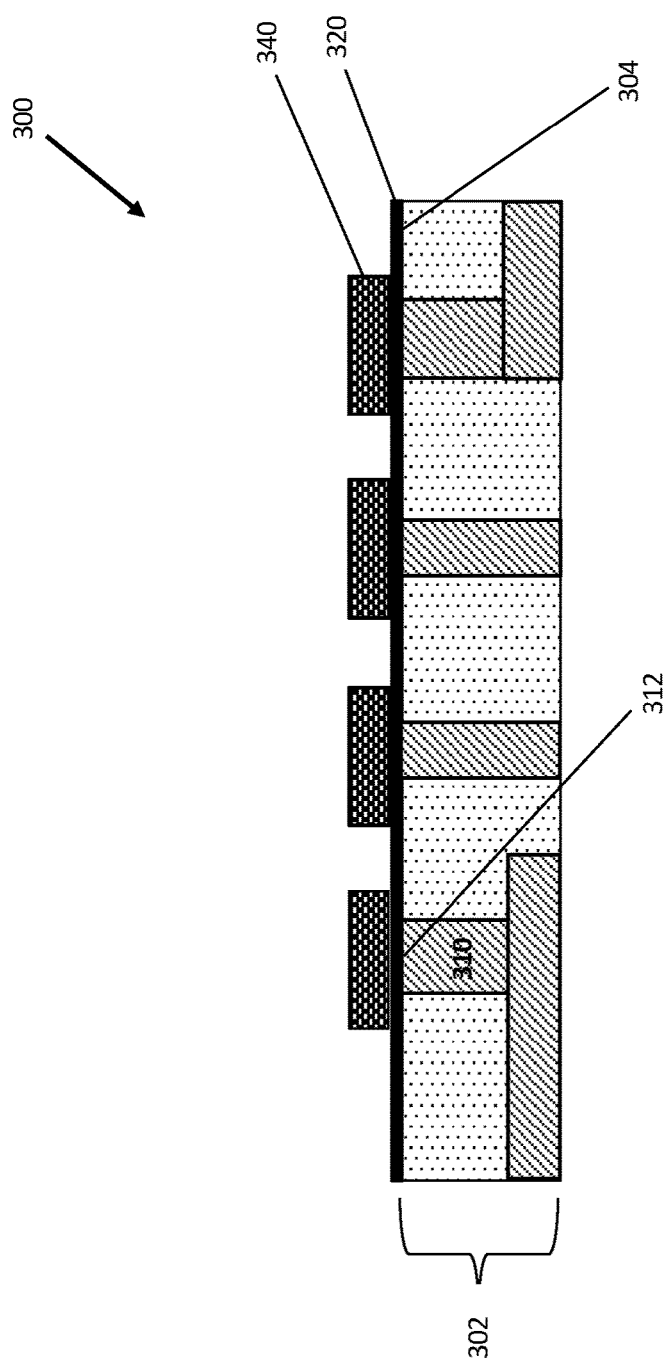
Figure 3F:
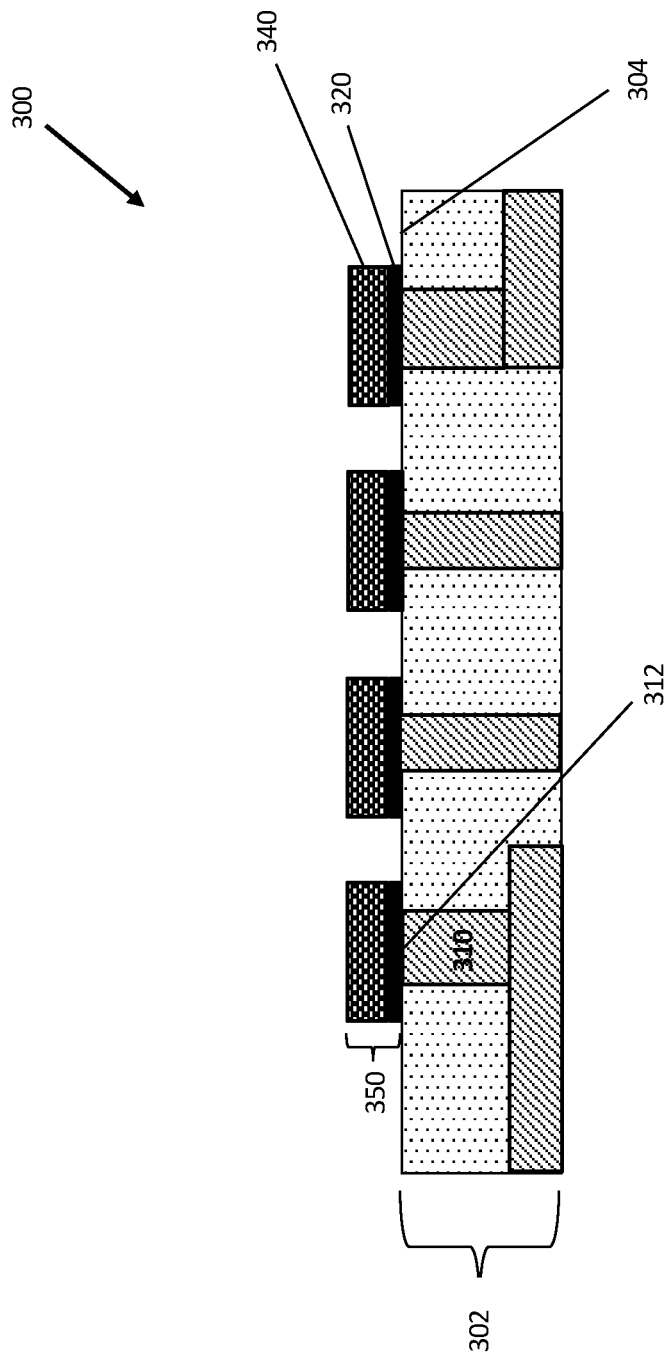

Referring to FIG. 3D, an NPG stack 340 may be plated on the seed layer 320 in the opening 332. NPG stack 340 may be, for example, a plating stack 128 described above that may be an NPG stack described above. Referring to FIG. 3E, lamination 330 may be removed. Referring to FIG. 3F, the seed layer 320 exposed by removal of the lamination 330 may be removed. Etching, for example, may be used to remove the seed layer 320 exposed by removal of the lamination 330. Further, material, for example, resist material, remaining from, for example, a patterning process used define a size or shape of a bond pad, may be removed by, for example, etching. The NPG stack 340 on the remaining seed layer 320 may form a bond pad 350, which may be, for example, bond pad 120 described above.

Figure 4:
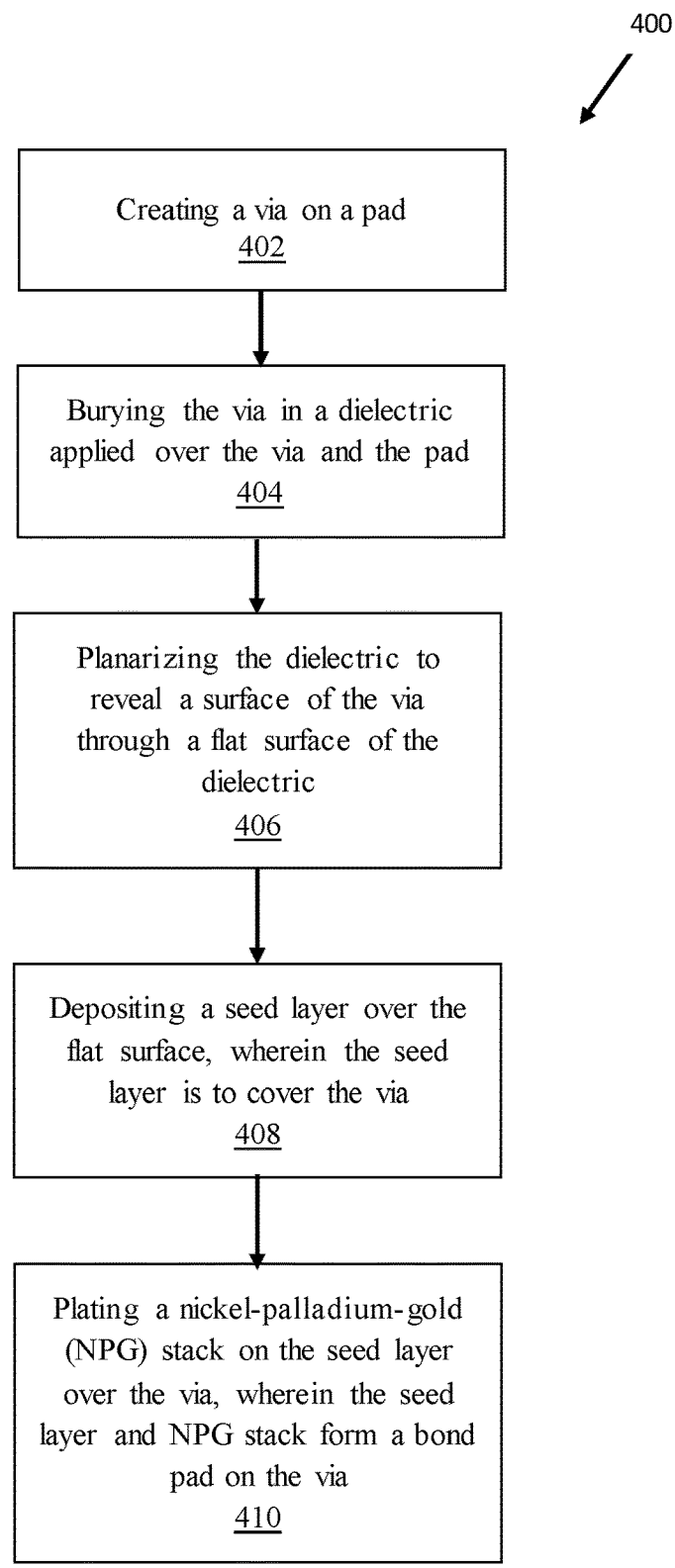
FIG. 4 depicts an example process of producing a package substrate, in accordance with various embodiments.

FIG. 4 depicts an example process of producing a package substrate, in accordance with various embodiments. In some embodiments, process 400 may include, at 402, creating a via on a pad. The pad may be, for example, a copper pad. Further, the pad may be an isolated pad, or the pad may have one or more traces, for example, one or more copper traces, emerging from the pad as part of an interconnect metal layer for the via. A via may be created using any process, such as, for example, a lithographic via (LiV) process, a self-aligned via process, a zero-misalignment process, a laser drilled via process, etc.

In some embodiments, process 400 may further include, at 404, burying the via in a dielectric applied over the via and the pad. In some embodiments, process 400 may further include, at 406, planarizing the dielectric to reveal a surface of the via through a flat surface of the dielectric. In some embodiments, planarizing the dielectric to reveal the surface of the via through the flat surface of the dielectric may include using a chemical process, a mechanical process, or a chemical-mechanical process to planarize the dielectric to reveal the surface of the via through the flat surface of the dielectric.

In some embodiments, process 400 may include, at 408, depositing a seed layer over the flat surface, where the seed layer may cover the via. In some embodiments, process 400 may further include, at 410, plating an NPG stack on the seed layer, where the seed layer and NPG stack form a bond pad on the via.

In some embodiments, process 400 may include defining a size or shape of the bond pad. In some embodiments, process 400 may further include placing a lamination on the seed layer, wherein the lamination includes an opening over the via, and wherein the NPG stack is plated in the opening. In some embodiments, process 400 may further include removing the lamination. In some embodiments, process 400 may include removing the seed layer exposed by removal of the lamination. In some embodiments, process 400 may include placing solder on the bond pad.

The formation of a bond pad through the direct deposition of a surface finish on a planarized surface and the application of a plating stack on that surface finish as described in embodiments herein, along with, for example, an LiV process, may provide an FLI with little thickness variation. Consequently, embodiments herein may enable a pitch, or scaling of a bump pitch, below 45 um. Thus, with regard to bump thickness variation (BTV) improvement, embodiments herein may minimize FLI thickness variation through planarization along with, for example, an LiV process, to provide a flat or substantially flat dielectric surface on which to apply a surface finish. In addition, a thin elytic plating stack may be achieved utilizing conformal plating, as the plating stack conforms to the contours of the surface finish, which may contribute to minimizing FLI thickness variation. Further, embodiments herein may be used with, for example, an embedded interconnect bridge (EmIB) process, for providing an interconnection between two IC die coupled with a package substrate.

Figure 5:
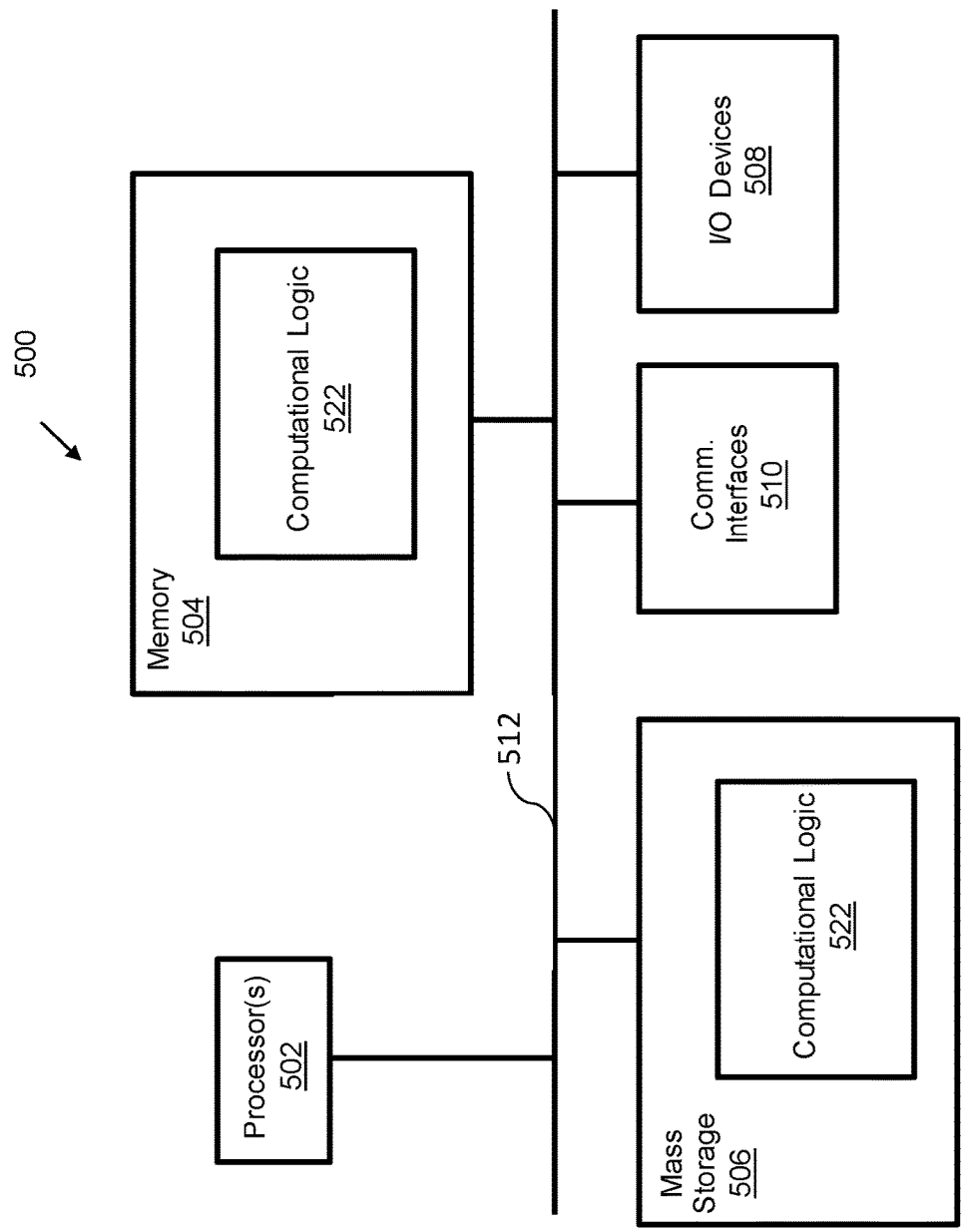
FIG. 5 depicts an example electronic device, in accordance with various embodiments.

FIG. 5 depicts an example electronic device, in accordance with various embodiments. Electronic device 500 may be suitable for use with various components of FIG. 1 or FIG. 2. As shown, electronic device 500 may include one or more processors or processor cores 502 and system memory 504. For the purpose of this application, including the claims, the terms "processor" and "processor cores" may be considered synonymous, unless the context clearly requires otherwise. The processor 502 may include any type of processors, such as a central processing unit (CPU), a microprocessor, and the like. The processor 502 may be implemented as an integrated circuit having multi-cores, e.g., a multi-core microprocessor. The processor 502 may be coupled with a package substrate, for example, package substrate 100 or package substrate 210, that includes bond pads, for example, bond pads 120 or bond pads 220, to form an IC package, for example, IC package 200.

The electronic device 500 may include mass storage devices 506 (such as diskette, hard drive, volatile memory (e.g., dynamic random-access memory (DRAM), compact disc read-only memory (CD-ROM), digital versatile disk (DVD), and so forth). In general, system memory 504 and/or mass storage devices 506 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

The electronic device 500 may further include I/O devices 508 (such as a display (e.g., a touchscreen display)), keyboard, cursor control, remote control, gaming controller, image capture device, a camera, one or more sensors, and so forth) and communication interfaces 510 (such as network interface cards, modems, infrared receivers, radio receivers (e.g., Bluetooth), and so forth).

The communication interfaces 510 may include communication chips (not shown) that may be configured to operate the device 500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond.

The above-described electronic device 500 elements may be coupled to each other via system bus 512. In the case of multiple buses, they may be bridged by one or more bus bridges (not shown). Each of these elements may perform its conventional functions known in the art. In particular, system memory 504 and mass storage devices 506 may be employed to store a working copy and a permanent copy of the programming instructions for the operation of various components of electronic device 500, including but not limited to an operating system of electronic device 500 and/or one or more applications. The various elements may be implemented by assembler instructions supported by processor(s) 502 or high-level languages that may be compiled into such instructions.

The permanent copy of the programming instructions may be placed into mass storage devices 506 in the factory, or in the field through, for example, a distribution medium (not shown), such as a compact disc (CD), or through communication interface 510 (from a distribution server (not shown)). That is, one or more distribution media having an implementation of the agent program may be employed to distribute the agent and to program various electronic devices.

The number, capability, and/or capacity of the elements 508, 510, 512 may vary, depending on whether electronic device 500 is used as a stationary electronic device, such as a set-top box or desktop computer, or a mobile electronic device, such as a tablet computing device, laptop computer, game console, or smartphone. Their constitutions are otherwise known, and accordingly will not be further described.

In embodiments, memory 504 may include computational logic 522 configured to implement various firmware and/or software services associated with operations of the electronic device 500. For some embodiments, at least one of processors 502 may be packaged together with computational logic 522 configured to practice aspects of embodiments described herein to form a System in Package (SiP) or a System on Chip (SoC).

In various implementations, the electronic device 500 may be one or more components of a data center, a laptop, a netbook, a notebook, an ultrabook, a smartphone, a tablet, a personal digital assistant (PDA), an ultra mobile PC, a mobile phone, a digital camera, or an IoT user equipment. In further implementations, the electronic device 500 may be any other electronic device that processes data.

Some non-limiting examples are provided below.

EXAMPLES

Example 1 may include a package substrate, comprising: a layer having a layer surface that is planarized; a via within the layer, wherein the via includes a via surface that is exposed on the layer surface, and wherein the via surface is planarized; and a bond pad on the layer surface, wherein a first thickness of the bond pad includes a seed layer on the via surface, and wherein a second thickness of the bond pad includes a plating stack on the seed layer.

Example 2 may include the package substrate of Example 1 or some other example herein, wherein the seed layer is a titanium-copper (Ti—Cu) layer, and wherein the titanium is on the layer surface, and wherein the copper is on the titanium.

Example 3 may include the package substrate of Example 2 or some other example herein, wherein a thickness of the titanium is less than 0.5 micrometers (um) and a thickness of the copper is less than 2.5 um.

Example 4 may include the package substrate of Example 1 or some other example herein, wherein the seed layer is one of a titanium layer, a tungsten-copper layer, wherein the tungsten is on the layer surface, and wherein the copper is on the tungsten, or a tantalum-copper layer, wherein the tantalum is on the layer surface, and wherein the copper is on the tantalum.

Example 5 may include the package substrate of Example 1, 2, 4, or some other example herein, wherein the plating stack is a nickel-palladium-gold stack, and wherein nickel is on the seed layer, palladium is on the nickel, and gold is on the palladium.

Example 6 may include the package substrate of Example 5 or some other example herein, wherein a thickness of the nickel is less than 10 um, a thickness of the palladium is less than 0.5 um, and a thickness of the gold is less than 5 um.

Example 7 may include the package substrate of Example 1, 2, 4, or some other example herein, wherein the plating stack is a cobalt/tungsten alloy-palladium-gold stack, and wherein the cobalt/tungsten alloy is on the seed layer, palladium is on the cobalt/tungsten alloy, and gold is on the palladium.

Example 8 may include the package substrate of Example 1, 2, 4, or some other example herein, wherein the plating stack is a nickel-copper stack, and wherein nickel is on the seed layer and copper is on the nickel.

Example 9 may include the package substrate of Example 1, 2, 4, or some other example herein, wherein the plating stack is one of an electrolytic stack or an electroless plating stack.

Example 10 may include the package substrate of Example 1, 2, 4, or some other example herein, further comprising solder on the bond pad.

Example 11 may include an integrated circuit (IC) package, comprising: a package substrate, wherein the package substrate includes a dielectric layer having a dielectric surface that is planarized; a via buried in the dielectric layer, wherein the via includes a via surface that is exposed on the dielectric surface, and wherein the via surface is planarized; and a bond pad on the dielectric surface, wherein a first thickness of the bond pad includes a surface finish on the via surface, and wherein a second thickness of the bond pad includes a plating stack on the surface finish; a die that includes an IC pad; and a solder ball coupled with the bond pad and the IC pad, to form a first level interconnect between the substrate package and the IC die.

Example 12 may include the IC package of Example 11 or some other example herein, wherein the surface finish is a seed layer that includes titanium and copper.

Example 13 may include the IC package of Example 12 or some other example herein, wherein a thickness of the titanium is less than 0.5 micrometers (um) and a thickness of the copper is less than 2.5 um.

Example 14 may include the IC package of Example 11, 12, 13, or some other example herein, wherein the plating stack is a nickel-palladium-gold stack, and wherein nickel is on top of the surface finish, palladium is on top of the nickel, and gold is on top of the palladium.

Example 15 may include the IC package of Example 14 or some other example herein, wherein a thickness of the nickel is less than 10 um, a thickness of the palladium is less than 0.5 um, and a thickness of the gold is less than 5 um.

Example 16 may include the IC package of Example 14 or some other example herein, wherein the plating stack is an electrolytic stack.

Example 17 may include a method of producing a package substrate, comprising: creating a via on a pad; burying the via in a dielectric applied over the via and the pad; planarizing the dielectric to reveal a top of the via through a flat surface of the dielectric; depositing a seed layer over the flat surface, wherein the seed layer is to cover the via; and plating a nickel-palladium-gold (NPG) stack on the seed layer over the via, wherein the seed layer and NPG stack form a bond pad on the via.

Example 18 may include the method of Example 17 or some other example herein, wherein planarizing the dielectric to reveal the top of the via through the flat surface of the dielectric includes using a chemical process, a mechanical process, or a chemical-mechanical (CMP) process to planarize the dielectric to reveal the top of the via through the flat surface of the dielectric.

Example 19 may include the method of Example 17, 18, or some other example herein, further comprising: defining a size or shape of the bond pad; placing a lamination on the seed layer, wherein the lamination includes an opening over the via, and wherein the NPG stack is plated in the opening; removing the lamination; and removing the seed layer exposed by removal of the lamination.

Example 20 may include the method of Example 17, 18, or some other example herein, further comprising placing solder on the bond pad.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package substrate, comprising:
   a layer having a layer surface that is planarized;
   a via within the layer, wherein the via includes a via surface that is exposed on the layer surface, and wherein the via surface is planarized; and
   a bond pad on the layer surface, wherein a first thickness of the bond pad includes a seed layer on the via surface, and wherein a second thickness of the bond pad includes a plating stack on the seed layer, wherein the plating stack is a nickel-palladium-gold stack, and wherein the nickel is in direct contact on the seed layer, the palladium is in direct contact on the nickel, and the gold is in direct contact on the palladium.

2. The package substrate of claim 1, wherein the seed layer is a titanium-copper (Ti—Cu) layer, and wherein the titanium is on the layer surface, and wherein the copper is on the titanium.

3. The package substrate of claim 2, wherein a thickness of the titanium is less than 0.5 micrometers (um) and a thickness of the copper is less than 2.5 um.

4. The package substrate of claim 1, wherein the seed layer is one of a titanium layer or a tungsten-copper layer, wherein the tungsten is on the layer surface, and wherein the copper is on the tungsten, or a tantalum-copper layer, wherein the tantalum is on the layer surface, and wherein the copper is on the tantalum.

5. The package substrate of claim 1, wherein a thickness of the nickel is less than 10 um, a thickness of the palladium is less than 0.5 um, and a thickness of the gold is less than 5 um.

6. The package substrate of claim 1, wherein the plating stack is one of an electrolytic stack or an electroless plating stack.

7. The package substrate of claim 1, further comprising solder on the bond pad.

8. An integrated circuit (IC) package, comprising:
   a package substrate, wherein the package substrate includes,
      a dielectric layer having a dielectric surface that is planarized;
      a via buried in the dielectric layer, wherein the via includes a via surface that is exposed on the dielectric surface, and wherein the via surface is planarized; and
      a bond pad on the dielectric surface, wherein a first thickness of the bond pad includes a surface finish on the via surface, and wherein a second thickness of the bond pad includes a plating stack on the surface finish, wherein the plating stack is a nickel-palladium-gold stack, and wherein the nickel is in direct contact on top of the surface finish, the palladium is in direct contact on top of the nickel, and the gold is in direct contact on top of the palladium;
   a die that includes an IC pad; and
   a solder ball coupled with the bond pad and the IC pad, to form a first level interconnect between the package substrate and the die.

9. The IC package of claim 8, wherein the surface finish is a seed layer that includes titanium and copper.

10. The IC package of claim 9, wherein a thickness of the titanium is less than 0.5 micrometers (um) and a thickness of the copper is less than 2.5 um.

11. The IC package of claim 8, wherein a thickness of the nickel is less than 10 um, a thickness of the palladium is less than 0.5 um, and a thickness of the gold is less than 5 um.

12. The IC package of claim 8, wherein the plating stack is an electrolytic stack.

13. A method of producing a package substrate, comprising:
   creating a via on a pad;
   burying the via in a dielectric applied over the via and the pad;
   planarizing the dielectric to reveal a top of the via through a flat surface of the dielectric;
   depositing a seed layer over the flat surface, wherein the seed layer is to cover the via; and
   plating a nickel-palladium-gold (NPG) stack on the seed layer over the via, wherein the nickel is in direct contact on the seed layer, the palladium is in direct contact on the nickel, and the gold is in direct contact on the palladium, and wherein the seed layer and the NPG stack form a bond pad on the via.

14. The method of claim 13, wherein planarizing the dielectric to reveal the top of the via through the flat surface of the dielectric includes using a chemical process, a mechanical process, or a chemical-mechanical process (CMP) to planarize the dielectric to reveal the top of the via through the flat surface of the dielectric.

15. The method of claim 13, further comprising:
defining a size or shape of the bond pad;
placing a lamination on the seed layer, wherein the lamination includes an opening over the via, and wherein the NPG stack is plated in the opening;
removing the lamination; and
removing the seed layer exposed by removal of the lamination.

16. The method of claim 13, further comprising placing solder on the bond pad.

17. A package substrate, comprising:
a layer having a layer surface that is planarized;
a via within the layer, wherein the via includes a via surface that is exposed on the layer surface, and wherein the via surface is planarized; and
a bond pad on the layer surface, wherein a first thickness of the bond pad includes a seed layer on the via surface, and wherein a second thickness of the bond pad includes a plating stack on the seed layer, wherein the plating stack is a cobalt/tungsten alloy-palladium-gold stack, and wherein the cobalt/tungsten alloy is in direct contact on the seed layer, the palladium is in direct contact on the cobalt/tungsten alloy, and the gold is in direct contact on the palladium.

18. The package substrate of claim 1, wherein the seed layer is a titanium-copper (Ti—Cu) layer, and wherein the titanium is on the layer surface, and wherein the copper is on the titanium.

19. The package substrate of claim 2, wherein a thickness of the titanium is less than 0.5 micrometers (um) and a thickness of the copper is less than 2.5 um.

20. The package substrate of claim 17, wherein the seed layer is one of a titanium layer or a tungsten-copper layer, wherein the tungsten is on the layer surface, and wherein the copper is on the tungsten, or a tantalum-copper layer, wherein the tantalum is on the layer surface, and wherein the copper is on the tantalum.

21. The package substrate of claim 1, wherein the plating stack is one of an electrolytic stack or an electroless plating stack.

* * * * *